United States Patent
Meister et al.

(10) Patent No.: US 10,473,735 B2
(45) Date of Patent: Nov. 12, 2019

(54) NMR PROBE COMPRISING A MULTI-PART LOWER INSERT PORTION

(71) Applicant: Bruker BioSpin AG, Faellanden (CH)

(72) Inventors: Roger Meister, Hinteregg (CH); Jonathan De Vries, Zurich (CH)

(73) Assignee: BRUKER SWITZERLAND AG, Faellanden (CH)

( * ) Notice: Subject to any disclaimer, the term of this patent is extended or adjusted under 35 U.S.C. 154(b) by 0 days.

(21) Appl. No.: 16/023,066

(22) Filed: Jun. 29, 2018

(65) Prior Publication Data
US 2019/0004126 A1 Jan. 3, 2019

(30) Foreign Application Priority Data
Jun. 29, 2017 (DE) .................. 10 2017 211 016

(51) Int. Cl.
*G01R 33/34* (2006.01)
*G01R 33/30* (2006.01)
(Continued)

(52) U.S. Cl.
CPC ......... *G01R 33/3403* (2013.01); *G01R 33/30* (2013.01); *G01R 33/31* (2013.01); *G01R 33/422* (2013.01)

(58) Field of Classification Search
CPC ............... G01R 33/307; G01R 33/31; G01R 33/34092; G01R 33/3403; G01R 33/46;
(Continued)

(56) References Cited

U.S. PATENT DOCUMENTS

| | | | | |
|---|---|---|---|---|
| 3,608,823 A | * | 9/1971 | Buschor | .................. B05B 5/032 239/698 |
| 4,797,727 A | * | 1/1989 | Niwayama | ............ H01L 23/051 257/116 |

(Continued)

FOREIGN PATENT DOCUMENTS

| | | |
|---|---|---|
| DE | 4018734 C2 | 12/1991 |
| DE | 102010029080 A1 | 11/2011 |

(Continued)

*Primary Examiner* — Alesa Allgood
(74) *Attorney, Agent, or Firm* — Edell, Shapiro & Finnan, LLC

(57) ABSTRACT

A temperature-controlled NMR probe has a lower insert portion formed of multiple parts including two disc-shaped sub-elements that are not mechanically rigidly interconnected, lie flat against one another in the mounted state and are perpendicular to the z axis. The first sub-element (3.1), in terms of material and geometric structure, fulfils the function of electrically insulating the RF and HV lines fed through the lower insert portion, has an electrical conductivity sigma<$10^3$ S/m, mechanically and retains components of the NMR probe constructed on the lower insert portion. The second sub-element (3.2) retains the first sub-element on a main frame (7) of the NMR probe, and is made of a ductile plastics material or metal having a mechanical breaking strength $\sigma>100$ N/mm$^2$ and a melting temperature $T_S>250°$ C. This achieves high breaking strength and resistance to thermal stress while simultaneously attaining required RF and HV properties.

20 Claims, 2 Drawing Sheets

(51) Int. Cl.
    *G01R 33/46*     (2006.01)
    *G01R 33/44*     (2006.01)
    *G01R 33/31*     (2006.01)
    *G01R 33/422*     (2006.01)

(58) Field of Classification Search
    CPC .......... G01R 33/34; G01N 24/08; G01V 3/32;
                      G01V 3/14; A61B 5/055; A61B
                            2090/374; G01Q 30/02; G01Q 60/38
    See application file for complete search history.

(56) References Cited

U.S. PATENT DOCUMENTS

| | | | |
|---|---|---|---|
| 5,192,910 A * | 3/1993 | Hepp | ........................ B01L 7/00 |
| | | | 324/315 |
| 9,482,729 B2 | 11/2016 | Gisler | |
| 2005/0122107 A1 | 6/2005 | Hasegawa et al. | |
| 2006/0096301 A1 | 5/2006 | Triebe et al. | |
| 2011/0284192 A1* | 11/2011 | Grossniklaus | ......... G01R 33/31 |
| | | | 165/135 |

FOREIGN PATENT DOCUMENTS

| | | |
|---|---|---|
| DE | 102012217601 B4 | 3/2014 |
| EP | 1655616 A1 | 5/2006 |

* cited by examiner

NMR PROBE COMPRISING A MULTI-PART LOWER INSERT PORTION

CROSS REFERENCE TO RELATED APPLICATIONS

This application claims foreign priority under 35 U.S.C. § 119(a)-(d) to German Application No. 10 2017 211 016.3 filed on Jun. 29, 2017, the entire contents of which are hereby incorporated into the present application by reference.

FIELD OF THE INVENTION

The invention relates to a temperature-controlled NMR (nuclear magnetic resonance) probe comprising an RF (radio frequency) coil system arranged around a vertical z axis and a disc-shaped lower insert portion arranged perpendicularly to the z axis, with which portion the electrical and mechanical components of the NMR probe, in particular the RF coil system as well as RF and HV (high voltage) lines, are supported and retained.

An arrangement of this type is known from DE 10 2012 217 601 B4.

BACKGROUND

NMR spectroscopy is an efficient method of instrumental analysis. In this process, RF pulses are radiated into a test sample, which is located in a strong, static magnetic field, and the RF reaction of the test sample is measured. Thereafter, the information is obtained integrally over a certain region of the test sample, known as the active volume. The test sample generally consists of a cylindrical sample tube, which contains the measurement substance to be examined in solid or liquid form. The sample tube is typically located in a spinner. The sample tube and spinner are transported from outside the magnet into the NMR probe using a transport system. When the sample tube is in the measurement position, the spinner is inside the turbine. The turbine allows the sample tube to rotate. In the measurement position, the sample tube is surrounded by one or more NMR coils. The innermost NMR coil has an inside diameter that is larger than the outside diameter of the measurement probe by as little as possible, since the space factor and thus the sensitivity of the NMR probe depends on the inside diameter and decreases as the inside diameter increases.

The temperature of the sample inherently influences the results of the NMR measurements. For high-quality measurements, the temperature is typically set using a temperature-control unit and is kept as spatially and temporally constant as possible over the active measurement volume. NMR measurements are typically carried out using both heated and cooled samples. (If the sample is intended to be cooled to below room temperature, a sufficiently cool temperature-control fluid flow is carried in the inflow pipe and heated to the desired temperature by the heater.) The spatial temperature gradient over the active measurement volume and the stability over time of the sample temperature have a significant impact on the quality of the NMR measurements. DE10 2010 029 080 A1 and DE 40 18 734 C2 disclose temperature-control units for minimizing the temperature gradients in the active measurement volume.

EP 1 655 616 A1 or US 2006/0096301 A1, for example, describe NMR equipment comprising an NMR cryogenic probe cooled to an operating temperature of <100 K and comprising a cooling circuit having thermally insulated cooling lines between the heat-insulated housing and the NMR cryogenic probe.

SUMMARY

For the temperature-controlled probes known from the prior art, the lower insert portion (until now always formed in one piece) is produced, primarily for reasons of RF behavior, from materials such as quartz or Macor®, which do not have a particularly high breaking strength, however. Mechanical stress on the lower insert portion, for example when coupling a dewar for cooling the apparatus, can therefore easily lead to the portion breaking, which generally requires very high repair and replacement costs. Thermal stresses can also lead to complications of this kind if the conventional lower insert portion does not withstand these strains in a durable manner.

In contrast, an object addressed by the present invention is that of modifying an NMR probe of the type defined at the outset using technical measures that are as simple as possible, such that the above-mentioned drawbacks are largely, above all permanently, prevented, and such that a particularly high breaking strength and a high resistance to thermal stresses is achieved while simultaneously ensuring the required RF and HV properties.

This complex problem is solved in a manner that is surprisingly simple as well as effective in that, for a generic NMR probe having the features defined at the outset, the lower insert portion is formed of multiple parts and comprises at least two substantially disc-shaped sub-elements that are not mechanically rigidly interconnected, lie flat against one another in the mounted state and are perpendicular to the z axis, in that the first sub-element, with regard to the choice of material and geometric structure thereof, fulfils the function of electrically insulating the RF and HV lines fed through the lower insert portion, the first sub-element having an electrical conductivity sigma<$10^3$ S/m, in that the first sub-element fulfils the function of mechanically retaining components of the NMR probe constructed on the lower insert portion, and in that the second sub-element, with regard to the choice of material thereof, takes over the function of mechanically retaining the first sub-element, including its structures, on a main frame of the NMR probe, and is made of a ductile plastics material or metal having a high mechanical breaking strength $\sigma$>100 N/mm$^2$ and a high melting temperature $T_S$>250° C. in each case.

In contrast to the usual, single-part design, the NMR probe according to the invention thus comprises a multi-part lower insert portion, for which the various requirements and functions can be optimized separately from one another in the individual sub-elements of the lower insert portion. In this case, the first sub-element is thus designed such that it can optimally fulfil the function of electrically insulating the RF and HV lines fed through the lower insert portion, while the second sub-element, owing to its design according to the invention, optimally takes over the function of mechanically retaining the first sub-element, including its structures, on a main frame of the NMR probe. The second sub-element in particular also absorbs thermal stresses that occur as a result of the temperature control of the NMR probe, which sub-element can be specifically designed for this purpose by virtue of a corresponding material selection.

Specifically owing to the possibilities of separately optimizing the mechanical and thermal properties of the lower insert portion and the RF and HV properties offered by the invention, the developer is provided with a particularly effective tool for a very specific, and optionally also rigorous, design of an NMR probe.

It should be expressly stated at this point that, although in the description of the present invention and in the claims reference is always made, for the sake of linguistic simplicity, to a "vertical z axis" and axial positions "above" or "below" the NMR coil system, the advantages of the invention can also be achieved using NMR systems having a horizontal or oblique z axis. Therefore, the specified axial positions do not necessarily need to be "above" or "below" the NMR coil system, but may optionally also be "right" or "left" of same. However, gravity plays a secondary role in the mode of operation of the present invention.

Particular embodiments of the NMR probe according to the invention in which the first sub-element is made of a ceramic material, of a glass ceramic material, in particular Macor®, of glass, of sapphire or of quartz have proven successful in practice. The first sub-element can thus primarily be optimized to RF and HV standards, while, in terms of its design, secondary priority can be dedicated to the mechanical/thermal stresses.

A class of embodiments of the NMR probe according to the invention in which the second sub-element is made of a ductile material, in particular polyether ether ketone (PEEK) is advantageous.

In this way, the risk of thermal stress cracks in the region of the temperature-control gas inlet is particularly reduced. The high ductility means that the risk of stress cracks, caused by the forces produced in the region of the mechanical coupling to the main frame, can be greatly reduced.

Another preferred embodiment of the NMR probe according to the invention is characterized in that the second sub-element comprises one or more recesses that pass completely through the disc plane and, in an operating state of the NMR probe in which it is mounted together with the first sub-element, leave a free passage in the z direction of the RF and HV lines fed through the first sub-element. The recesses may be designed freely such that the RF and HV elements can be removed as far away as possible from proton-containing, ductile and mechanically stressed "support elements", which may cause undesired base signal.

A class of embodiments in which a device is provided for controlling the temperature of the NMR probe, in particular for cooling to cryogenic temperatures TK<200K, which device preferably comprises a dewar and temperature-control-gas-carrying through-channels, is also particularly preferred.

In advantageous developments of this class of embodiments, a fluid or gas seal is arranged between the second sub-element and the temperature-control-gas-carrying through-channels.

Variants of this class of embodiments that are characterized in that the surface F of the first disc-shaped sub-element, which, in the mounted operating state of the NMR probe, rests on the second disc-shaped sub-element, is selected so as to be of such a size that the air-carrying through-channels are also sealed in a fluid-tight or gas-tight manner by the sub-elements, in particular F>0.10 cm$^2$, are particularly preferred.

An embodiment of the NMR probe according to the invention that is characterized in that the sub-elements comprise continuous recesses along the z axis, in particular for feeding a trimmer and/or NMR coil legs and/or gradient supply lines and/or a temperature sensor therethrough, is also preferred.

Other advantageous embodiments of the invention are characterized in that the disc-shaped first sub-element is mechanically attached to a main frame of the NMR probe via the second sub-element.

Embodiments of the NMR probe according to the invention in which the material of the first sub-element does not have an open porosity and is hydrogen-free have proven successful in practice.

Embodiments of the invention in which the loss factor tan δ of the first sub-element is less than 0.01 are especially advantageous.

Embodiments of the invention in which the dielectric constant ε of the first sub-element is less than 10 are preferred.

Preferred embodiments of the NMR probe according to the invention may also allow for an RF shielding tube to be provided which is preferably constructed in at least two parts, in particular in multiple parts, in the z direction.

In advantageous developments of these embodiments, a first portion of the shielding tube, which, in an operating state of the NMR probe, surrounds a test sample, has a uniform length in the z direction, while a second portion of the shielding tube is designed to have any desired selectable length in the z direction.

An NMR measuring arrangement comprising an NMR probe of the above-described type according to the invention, which may also comprise an NMR magnet system, a shim system, a turbine and an apparatus for transporting a sample tube from outside the NMR magnet system into the measurement position of the sample tube in the NMR probe, also falls within the scope of the present invention. The multi-part lower insert portion according to the invention comes into effect in particular in the entire system of NMR probe, NMR magnet and transport apparatus, since this combination allows the sample tubes to be automatically exchanged, which is very important in high-throughput NMR applications, for example. The arrangement according to the invention makes a significant contribution to these applications, since it allows targeted individual optimization of the particular functional part by providing a physical separation of the function of retaining and attaching while absorbing mechanical stresses on the one hand, and absorbing thermal stresses on the other hand, as a result of which subsequent damages of the NMR probe during operation can be prevented.

Further advantages of the invention can be found in the description and the drawings. Likewise, the features according to the invention that are mentioned above and set out in the following can each be used individually per se or together in any combinations. The embodiments shown and described are not to be understood as an exhaustive list, but instead are of an exemplary nature for describing the invention.

BRIEF DESCRIPTION OF THE DRAWINGS

Exemplary embodiments will be described in greater detail with reference to the drawings.

DETAILED DESCRIPTION

The present invention relates to the construction of a specific lower insert portion in a temperature-controlled probe of an NMR measuring arrangement that generally comprises an NMR magnet system, a shim system, a turbine and an apparatus for transporting a sample tube from outside the NMR magnet system into the measurement position of the sample tube in the NMR probe.

Figure 3:
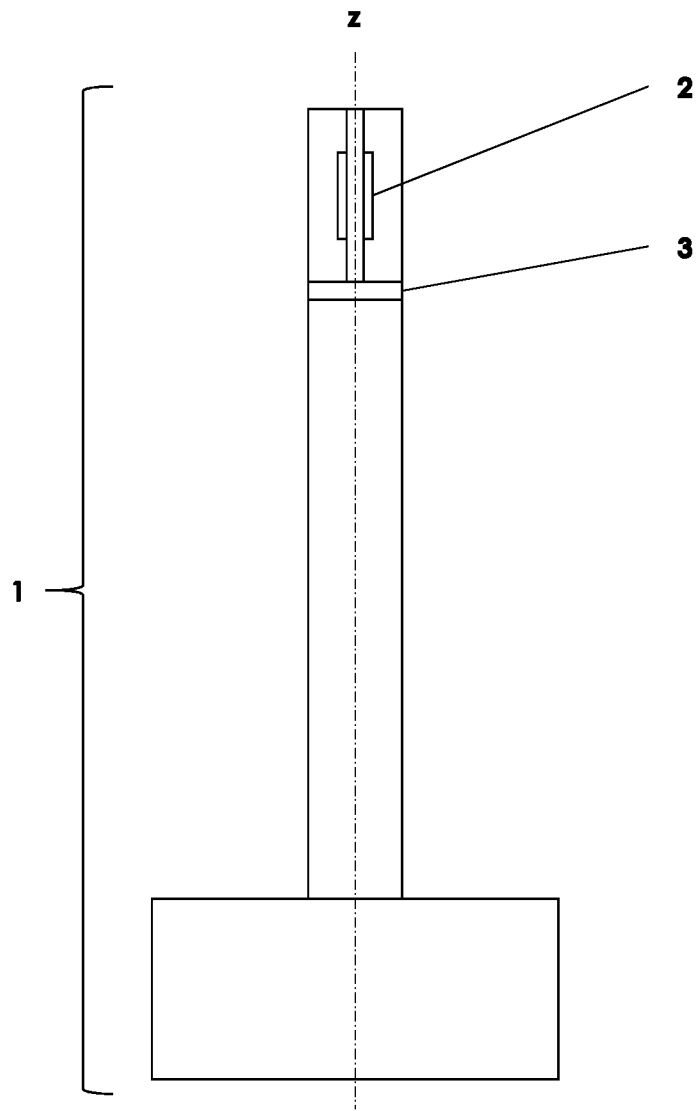
FIG. 3 is a schematic side view of a conventional NMR probe having a single-part lower insert portion according to the prior art.

An NMR probe 1 of this type according to the prior art, as shown in FIG. 3, generically comprises an RF coil system 2 arranged around a vertical axis of symmetry z of an NMR magnet system (not shown in more detail in the drawings) and a disc-shaped lower insert portion 3 arranged perpendicularly to the z axis. The portion supports and retains the electrical and mechanical components of the NMR probe 1, in particular the RF coil system 2 as well as RF and HV lines.

The present invention is characterized in that the lower insert portion 3 is formed of multiple parts and comprises at least two substantially disc-shaped sub-elements 3.1; 3.2 that are not mechanically rigidly interconnected, lie flat against one another in the mounted state and are perpendicular to the z axis, in that the first sub-element 3.1, with regard to the choice of material and geometric structure thereof, is designed such that it fulfils the function of electrically insulating the RF and HV lines fed through the lower insert portion 3, the first sub-element 3.1 having an electrical conductivity sigma<$10^3$ S/m, in that the first sub-element 3.1 fulfils the function of mechanically retaining components of the NMR probe 1 constructed on the lower insert portion 3, and in that the second sub-element 3.2, with regard to the choice of material thereof, is designed such that the second sub-element 3.2 takes over the function of mechanically retaining the first sub-element 3.1, including its structures, on a main frame 7 of the NMR probe 1, and is made of a ductile plastics material or metal having a high mechanical breaking strength $\sigma>100$ N/mm$^2$ and a high melting temperature $T_S>250°$ C. in each case.

Figure 1:
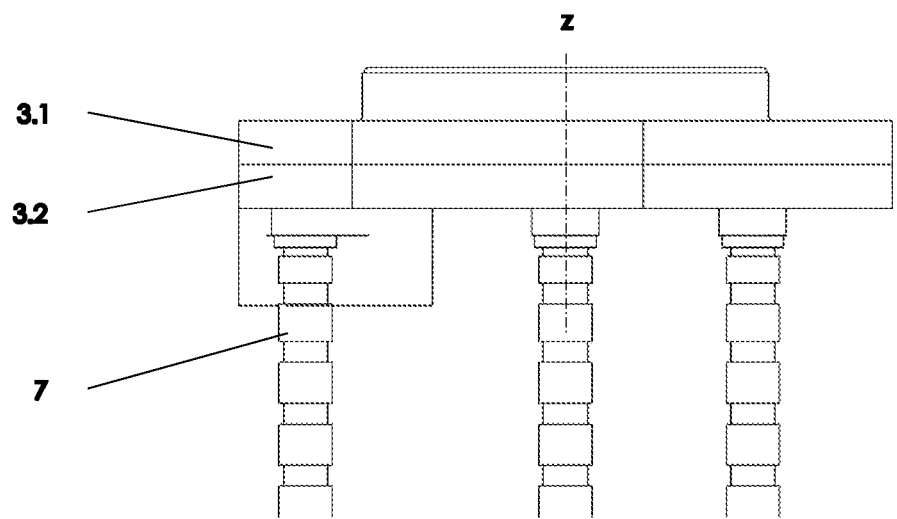
FIG. 1 is a schematic side view of an embodiment of the NMR probe according to the invention, comprising a multi-part disc-shaped lower insert portion attached to the main frame.

FIG. 1 shows an embodiment in which a disc-shaped sub-element 3.1 of this kind is mechanically attached to the main frame 7 of the NMR probe 1 via the second sub-element 3.2.

Figure 2:
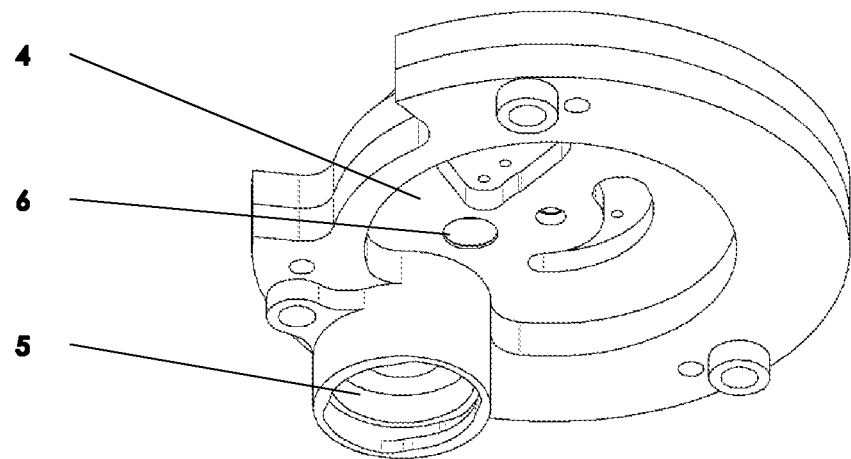
FIG. 2 is a three-dimensional view of an embodiment of the multi-part disc-shaped lower insert portion shown obliquely from below.

As is very clearly discernable in FIG. 2, in the lower insert portion 3 designed according to the invention, the second sub-element 3.2 may comprise one or more recesses 4 that completely traverse the disc plane and, in an operating state of the NMR probe 1 in which it is mounted together with the first sub-element 3.1, leave a free passage in the z direction of the RF and HV lines fed through the first sub-element 3.1.

A device for controlling the temperature of the NMR probe 1, in particular for cooling to cryogenic temperatures $T_K<200K$, which device preferably comprises a dewar, is not shown in more detail in the figures of the drawings, because it is not substantially modified with respect to the known prior art.

This temperature-control device may comprise temperature-control-gas-carrying through-channels 5, as shown in FIG. 2. A fluid and/or gas seal is arranged between these through-channels 5 and the second sub-element 3.2.

The surface F, with which, in the mounted operating state of the NMR probe 1, the first disc-shaped sub-element 3.1 rests on the second disc-shaped sub-element 3.2, is selected so as to be of such a size that the air-carrying through-channels 5 are also sealed in a fluid-tight or gas-tight manner by the sub-elements 3.1; 3.2, in particular F>0.10 cm$^2$.

The sub-elements 3.1; 3.2 comprise continuous recesses 6 along the z axis, in particular for feeding a trimmer and/or NMR coil legs and/or gradient supply lines and/or a temperature sensor therethrough.

Embodiments of the invention in which an RF shielding tube is provided which is preferably constructed in at least two parts, in particular in multiple parts, in the z direction, are not expressly shown in the figures of the drawings. In this case, a first portion of the shielding tube, which, in an operating state of the NMR probe 1, surrounds a test sample, has a uniform length in the z direction, while a second portion of the shielding tube is designed to have any desired selectable length in the z direction.

The first sub-element 3.1 may be made of a ceramic material, of a glass ceramic material, in particular Macor®, of glass, of sapphire or of quartz. In addition, the material of the first sub-element 3.1 is not intended to have an open porosity and is intended to be hydrogen-free. The loss factor tan δ of the first sub-element 3.1 is intended to be less than 0.01 and its dielectric constant ε is intended to be less than 10.

The second sub-element 3.2 is made of a ductile material, in particular polyether ether ketone (PEEK).

LIST OF REFERENCE SIGNS

1 temperature-controlled NMR probe
2 RF coil system
3 disc-shaped lower insert portion
3.1 first sub-element
3.2 second sub-element
4 traversing recesses in the second sub-element
5 temperature-control-air-carrying through-channels
6 traversing recesses in the sub-elements
7 main frame of the NMR probe
z axis of symmetry of the magnet coil assembly

What is claimed is:
1. Temperature-controlled nuclear magnetic resonance (NMR) probe comprising:
an RF coil system arranged around a vertical z axis,
electrical and mechanical components, and
a disc-shaped lower insert portion arranged perpendicularly to the z axis and configured to support and/or retain the electrical and mechanical components of the NMR probe,
wherein the lower insert portion is formed of multiple parts and comprises at least first and second substantially disc-shaped sub-elements that are not mechanically rigidly interconnected, that lie flat against one another when in a mounted state and that are arranged perpendicularly to the z axis,
wherein the first sub-element is formed of a material and has a geometric structure that electrically insulates the components, such that the first sub-element has an electrical conductivity sigma<$10^3$ S/m,
wherein the first sub-element is configured to mechanically support and/or retain the components, and
wherein the second sub-element is formed of a ductile plastics material or metal that mechanically retains the first sub-element on a main frame of the NMR probe, wherein the ductile plastics material or metal has a mechanical breaking strength $\sigma>100$ N/mm$^2$ and a melting temperature $T_S>250°$ C.

2. NMR probe according to claim 1, wherein the electrical and mechanical components comprise a radio frequency (RF) coil system and RF and high voltage (HV) lines, and wherein the first sub-element electrically insulates the RF and HV lines.

3. NMR probe according to claim 1, wherein the first and second sub-elements comprise continuous recesses along the z axis.

4. NMR probe according to claim 1, wherein the disc-shaped first sub-element is mechanically attached to a main frame of the NMR probe via the second sub-element.

5. NMR probe according to claim 1, wherein the material of the first sub-element has no open porosity and is hydrogen-free.

6. NMR probe according to claim 1, wherein a loss factor tan δ of the first sub-element is less than 0.01.

7. NMR probe according to claim 1, wherein a dielectric constant ε of the first sub-element is less than 10.

8. NMR measuring arrangement comprising an NMR probe according to claim 1, and further comprising an NMR magnet system, a shim system, a turbine and an apparatus for transporting a sample tube from outside the NMR magnet system into a measurement position of the sample tube in the NMR probe.

9. NMR probe according to claim 1, wherein the first sub-element is made of a ceramic material, of a glass ceramic material, of glass, of sapphire or of quartz.

10. NMR probe according to claim 9, wherein the glass ceramic material is Macor®.

11. NMR probe according to claim 1, wherein the second sub-element is made of a ductile plastics material.

12. NMR probe according to claim 11, wherein the ductile plastics material is polyether ether ketone (PEEK).

13. NMR probe according to claim 1, wherein the second sub-element comprises at least one recess that extends completely through the disc and, when in the mounted state with the first sub-element, leaves a free passage in a direction of the z axis for the components supported and/or retained by the first sub-element.

14. NMR probe according to claim 13, wherein the electrical and mechanical components comprise an RF coil system and RF and HV lines, and wherein the second sub-element comprises at least one recess that extends completely through the disc and, when in the mounted state with the first sub-element, leaves a free passage in the direction of the z axis for the RF and HV lines fed through the first sub-element.

15. NMR probe according to claim 1, further comprising a device for controlling a temperature of the NMR probe.

16. NMR probe according to claim 15, wherein the device is configured to cool the probe to cryogenic temperatures $T_K<200K$, and comprises a dewar and temperature-control-gas-carrying through-channels.

17. NMR probe according to claim 16, further comprising a fluid or gas seal arranged between the second sub-element and the temperature-control-gas-carrying through-channels.

18. NMR probe according to claim 16, wherein a surface of the first disc-shaped sub-element that rests on the second disc-shaped sub-element in a mounted state of the NMR probe has a size that the through-channels are sealed in a fluid-tight manner by the first and second sub-elements.

19. NMR probe according to claim 1, further comprising an RF shielding tube which is constructed in at least two parts in a direction of the z axis.

20. NMR probe according to claim 19, wherein a first portion of the shielding tube, which, in an operating state of the NMR probe, surrounds a test sample, has a uniform length in the z direction, while a second portion of the shielding tube has a desired selectable length in the z direction.

* * * * *